United States Patent
Fowlkes et al.

(10) Patent No.: US 8,110,915 B2
(45) Date of Patent: Feb. 7, 2012

(54) OPEN CAVITY LEADLESS SURFACE MOUNTABLE PACKAGE FOR HIGH POWER RF APPLICATIONS

(75) Inventors: Donald Fowlkes, San Jose, CA (US); Soon Ing Chew, Milpitas, CA (US)

(73) Assignee: Infineon Technologies AG, Neubiberg (DE)

( * ) Notice: Subject to any disclaimer, the term of this patent is extended or adjusted under 35 U.S.C. 154(b) by 293 days.

(21) Appl. No.: 12/580,304

(22) Filed: Oct. 16, 2009

(65) Prior Publication Data

US 2011/0089529 A1   Apr. 21, 2011

(51) Int. Cl.
H01L 23/48 (2006.01)
H01L 21/52 (2006.01)

(52) U.S. Cl. . 257/692; 257/704; 257/728; 257/E21.499; 257/E23.061; 438/107; 438/121

(58) Field of Classification Search ............ 257/678, 257/690, 692, 693, 704, 723, 724, 728, E21.499, 257/E23.006, E23.061; 438/106, 107, 121
See application file for complete search history.

(56) References Cited

U.S. PATENT DOCUMENTS

| | | | | |
|---|---|---|---|---|
| 6,455,925 | B1* | 9/2002 | Laureanti | 257/678 |
| 6,885,563 | B2* | 4/2005 | Panella et al. | 361/794 |
| 7,348,663 | B1* | 3/2008 | Kirloskar et al. | 257/704 |
| 7,417,198 | B2* | 8/2008 | Betz et al. | 174/536 |
| 7,479,691 | B2 | 1/2009 | Ewe et al. | |
| 2002/0014694 | A1 | 2/2002 | Olofsson | |
| 2007/0096293 | A1* | 5/2007 | Wen et al. | 257/704 |
| 2010/0046184 | A1* | 2/2010 | Yasooka | 361/767 |

OTHER PUBLICATIONS

Merix Corporation, "Technical Bulletin: E-Coin: Embedded Copper Technology," Jun. 1, 2007, p. 1, Rev. 1.1, Forest Grove, Oregon.
Ruwel GmbH, "Ruwel Heat Management Concepts: Copper Inlay Technology: A New Smart Solution to Dissipate Heat," 2008, pp. 1-2, Geldern, Germany.

* cited by examiner

Primary Examiner — Tuan N. Quach
(74) Attorney, Agent, or Firm — Murphy, Bilak & Homiller, PLLC (57) ABSTRACT

An RF semiconductor package includes a substrate having generally planar top and bottom surfaces. The substrate includes a metallic base region and one or more metallic signal terminal regions extending from the top surface to the bottom surface, and an insulative material separating the metallic regions from one another. The bottom surface of an RF semiconductor die is surface-mounted to the base region at the top substrate surface. The RF semiconductor die has a terminal pad disposed at a top surface of the RF semiconductor die. The terminal pad is electrically connected to one of the signal terminal regions at the top substrate surface. A lid is attached to the top substrate surface so that the RF semiconductor die is enclosed by the lid to form an open-cavity around the RF semiconductor die. The base and signal terminal regions are configured for surface-mounting at the bottom substrate surface.

26 Claims, 10 Drawing Sheets

OPEN CAVITY LEADLESS SURFACE MOUNTABLE PACKAGE FOR HIGH POWER RF APPLICATIONS

BACKGROUND

Packages for RF power semiconductors take many forms, each having particular advantages and disadvantages. For example, packages having straight leads that extend outward beyond the sides of an insulative layer create a very long inductance path which is undesirable for RF applications. An electrically and thermally conductive metal flange which forms part of the insulative layer provides a ground connection to an RF power semiconductor die mounted to the flange. The conductive flange also dissipates heat from the RF power semiconductor die. Straight lead-type packages require manual and time consuming assembly processes for mounting the signal leads and flange onto a PCB. The PCB typically has a cavity region for receiving the flange, which is attached to a larger heat sink disposed at the backside of the PCB for greater heat dissipation capacity. A cavity may also be machined into the heat sink for receiving part of the flange. Such non-planar, non-surface-mountable packaging arrangements require manual assembly and soldering processes for manufacturing the final package-PCB structure.

Gull wing-type RF power packages have signal leads which extend outward from the top surface of an insulative substrate. While the signal leads for a gull wing package can be surface-mounted to a PCB, the leads have a very long inductive path. Long inductive paths are especially problematic for RF power applications as the frequency and power levels increase. Straight lead-type RF power packages are more common than gull wing-type packages, but are not surface-mountable due to the signal leads being offset from the base of the package as described above. Also, straight-lead power packages require specially designed PCBs and heat sinks in order to adapt to the package structure also as described above, increasing assembly time and cost.

RF power packages typically require an attachment mechanism such as a solder bond, screws, retaining spring, or a thermally conductive adhesive, for attaching the package to a PCB and larger heat sink. When an RF power package is attached to a PCB and larger heat sink by screws, one or more screw holes must be provided in both the mounting flange of the package and the larger heat sink, requiring separate assembly steps by the manufacturer of circuit boards using such RF power devices. Further, the RF power devices have input and output lead frames attached to the sides of the mounting flanges, which typically require a hand soldering step separate from the normal solder reflow process. These extra steps in the manufacturing process increase manufacturing cost and reduce yield.

SUMMARY

According to an embodiment of an RF semiconductor package, the package includes a substrate, an RF semiconductor die and a lid. The substrate has generally planar top and bottom surfaces. The substrate includes a metallic base region extending from the top surface to the bottom surface, one or more metallic signal terminal regions extending from the top surface to the bottom surface without extending laterally outward from the substrate, and an insulative material separating the metallic regions from one another. The RF semiconductor die has a bottom surface surface-mounted to the base region of the substrate at the top surface of the substrate. The RF semiconductor die also has a terminal pad disposed at a top surface of the RF semiconductor die, the terminal pad being electrically connected to one of the signal terminal regions of the substrate at the top surface of the substrate. The lid is attached to the top surface of the substrate so that the RF semiconductor die is enclosed by the lid to form an open-cavity around the RF semiconductor die. The base region and each signal terminal region of the substrate are configured for surface-mounting at the bottom surface of the substrate.

According to an embodiment of an RF semiconductor package assembly, the assembly includes a substrate, an RF semiconductor die, a lid and a circuit board. The substrate has generally planar top and bottom surfaces. The substrate includes a metallic base region extending from the top surface to the bottom surface, one or more metallic signal terminal regions extending from the top surface to the bottom surface without extending laterally outward from the substrate, and an insulative material separating the metallic regions from one another. The RF semiconductor die has a bottom surface surface-mounted to the base region of the substrate at the top surface of the substrate. The RF semiconductor die also has a terminal pad disposed at a top surface of the RF semiconductor die, the terminal pad being electrically connected to one of the signal terminal regions of the substrate at the top surface of the substrate. The lid is attached to the top surface of the substrate so that the RF semiconductor die is enclosed by the lid to form an open-cavity around the RF semiconductor die. The circuit board has a generally planar top surface with conductors surface-mounted to the base region and each signal terminal region of the substrate at the bottom surface of the substrate.

According to an embodiment of an RF semiconductor substrate, the substrate includes a plurality of metallic base regions extending from a generally planar top surface of the RF semiconductor substrate to a generally planar bottom surface of the RF semiconductor substrate. The plurality of base regions are spaced apart from one another by an insulative material. The RF semiconductor substrate further includes a pair of metallic signal terminal regions adjacent first and second opposing sides of each base region. Each signal terminal region extends from the top surface to the bottom surface without extending laterally outward from the substrate and is separated from each base region and the other signal terminal regions by the insulative material. Each base region and corresponding pair of signal terminal regions is configured to be surface-mounted at the top surface of the RF semiconductor substrate to a bottom surface of an RF semiconductor die. The top surface of the RF semiconductor substrate is configured to have a lid attached to the top surface so that each RF semiconductor die is enclosed by the lid to form an open-cavity around each RF semiconductor die. Each base region and corresponding pair of signal terminal regions are configured for surface-mounting at the bottom surface of the RF semiconductor substrate.

Those skilled in the art will recognize additional features and advantages upon reading the following detailed description, and upon viewing the accompanying drawings.

DETAILED DESCRIPTION

Figure 1:
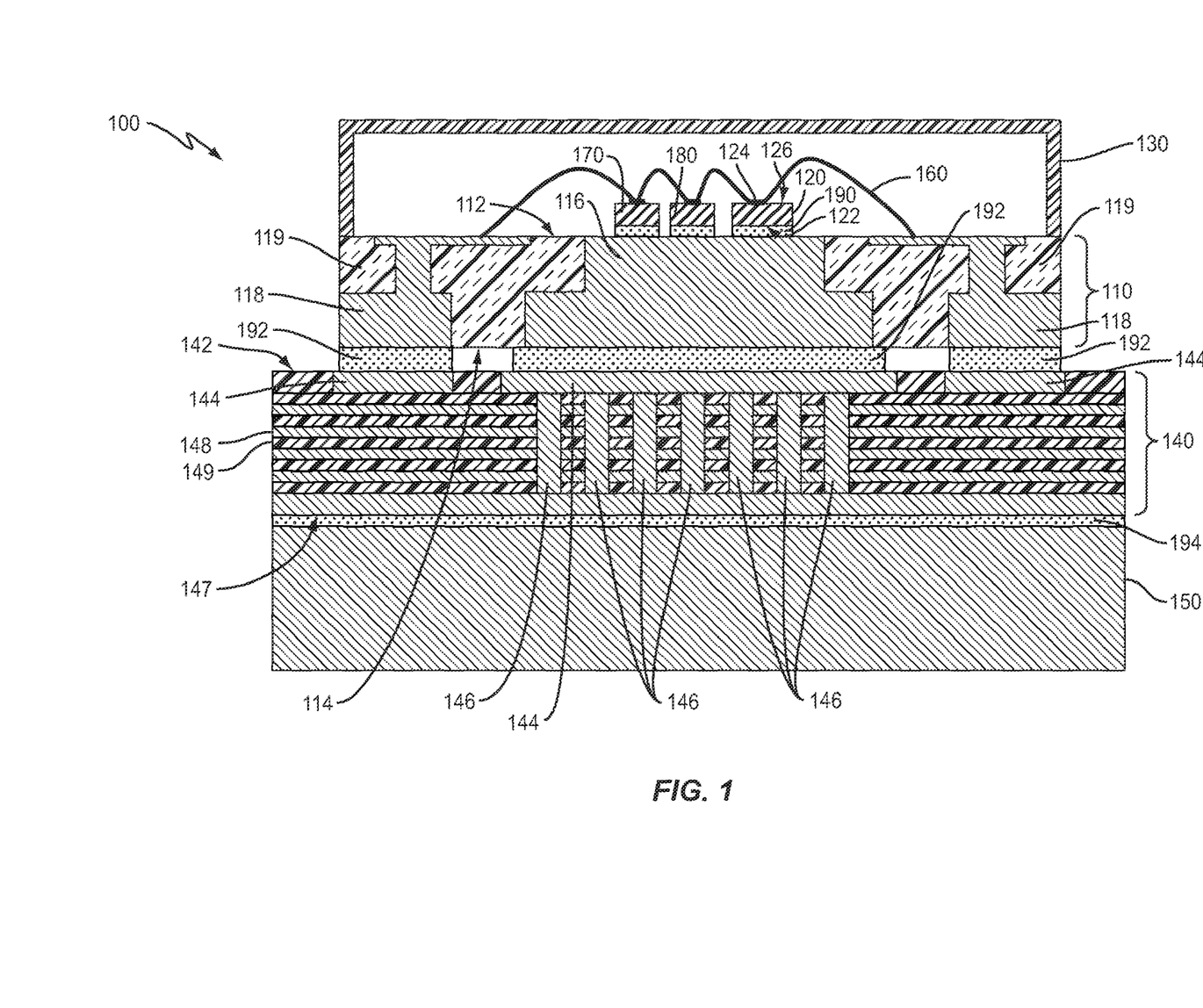
FIG. 1 is a width-wise cross-section view of an embodiment of an RF semiconductor package assembly.

FIG. 1 illustrates a width-wise cross-section view of an embodiment of an RF semiconductor package assembly 100. The semiconductor package assembly 100 includes a substrate 110, one or more RF semiconductor dies 120, a lid 130, a circuit board 140 and a larger heat sink 150. The substrate 110 has generally planar top and bottom surfaces 112, 114. That is, the top and bottom substrate surfaces 112, 114 are relatively flat, but may have some minor unevenness that is within manufacturing tolerances. The substrate 110 includes a metallic base region 116, e.g. made of copper, copper alloy or any other suitable metal, extending from the top substrate surface 112 to the bottom substrate surface 114. The bottom surface 122 of the RF semiconductor die(s) 120 is surface-mounted to the base region 116 of the substrate 110 at the top substrate surface 112, e.g. using a solder material 190. The base region 116 dissipates heat generated by the RF semiconductor die(s) 120 and also acts as a point of electrical contact for the RF semiconductor die(s) 120, e.g. as a ground node. The metallic base region 116 can be relatively thick, e.g. on the order of 1 mm or larger in some embodiments, and thus can dissipate large amounts of heat and maintain open cavity package stability during assembly and operation.

The substrate 110 further includes one or more metallic signal terminal regions 118, e.g. made of copper, copper alloy or any other suitable metal. Each signal terminal region 118 extends from the top substrate surface 112 to the bottom substrate surface 114. Unlike conventional gull wing-type leads, the signal terminal regions 118 do not extend laterally outward from the substrate 110, and thus electrical connections are made at the top and bottom of the substrate 110 and not the sides. An insulative material 119 such as an epoxy or any other suitable insulator separates the metallic regions 116, 118 from one another. One or more signal terminal pads 124 are disposed at the top surface 126 of the RF semiconductor die(s) 120. Each terminal pad 124 of the RF semiconductor die(s) 120 is electrically connected to one of the signal terminal regions 118 of the substrate 110 at the top surface 112 of the substrate 110. In one embodiment, a first one of the signal terminal regions 118 of the substrate 110 is electrically coupled to the terminal pad 124 associated with an input of the RF semiconductor die 120. A second one of the signal terminal regions 118 is electrically coupled to the terminal pad 124 associated with an output of the RF semiconductor die 120. The base region is connected to the bottom surface 122 of the die 120, which forms a source terminal for the die 120 according to this embodiment, e.g. ground.

One or more additional ones of the terminal pads 124 of the RF semiconductor die 120 may correspond to other types of signal terminals. One or more of the die terminal pads 124 can be directly connected to respective ones of the substrate signal terminal regions 118, e.g. using bond wires 160, ribbons or some other type of conductor as shown on the right-hand side of the RF semiconductor die 120 in FIG. 1. One or more different ones of the RF die terminal pads 124 can be connected to respective ones of the substrate signal terminal regions 118 through one or more support die 170, 180 surface-mounted to the base region 116 of the substrate 110 as shown on the left-hand side of the RF semiconductor die 120 in FIG. 1. For example, a terminal pad 124 on the top surface 126 of the RF semiconductor die 120 can be connected to a terminal pad 124 on one of the support die 170, 180.

The support die 170, 180 can be other RF semiconductor die, passive components such as capacitors, inductors, resistors, transformers, etc. or other types of die. For example, the support die 170, 180 can form input and/or output matching networks for the RF semiconductor die(s) 120. The matching networks tune the input and output impedances of the package inside the module assembly. In one embodiment, input and/or output matching networks are provided when the RF semiconductor die(s) 120 is designed as an RF power amplifier.

The lid 130 is attached to the top surface 112 of the substrate 110 so that the RF semiconductor die(s) 120 and optional support die 170, 180 are enclosed by the lid 130 to form an open-cavity around the die 120, 170, 180. The cavity is open rather than over-molded so that the die 120, 170, 180 are not encased in any type of mold compound which would have detrimental effects on RF performance. The bottom surface 114 of the substrate 110 is surface-mounted to the circuit board 140, which has a generally planar top surface 142. Particularly, conductors 144 embedded in the top surface 142 of the circuit board 140 are surface-mounted to the base region 116 and each signal terminal region 118 of the substrate 110 at the bottom surface 114 of the substrate 110, e.g. using a solder material 192. The conductors 144 included on the circuit board 140 can include copper, copper alloy or any other suitable metal.

In one embodiment, the circuit board 140 is a multi-layer printed circuit board (PCB) and includes a plurality of conductive vias 146 for dissipating heat from the base region 116 of the substrate 110 as shown in FIG. 1. The conductive vias 146 extend from the bottom surface 147 of the multi-layer PCB 140 to the conductor 144 at the top surface 142 of the multi-layer PCB 140 which is surface-mounted to the base region 116 of the substrate 110. The multi-layer PCB 140 also has alternating layers of signal conductors 148 and insulative material 149 for isolating the signal conductors 148 from one another. The bottom surface 147 of the multi-layer PCB 140 can be attached to the large heat sink 150, e.g. using a solder layer 194. Heat energy generated by the RF semiconductor die(s) 120 transfers from the base region 116 of the substrate 110 to the conductive vias 146 extending through the multi-layer PCB 140 and then to the larger heat sink 150 for dissipation.

Figure 2:
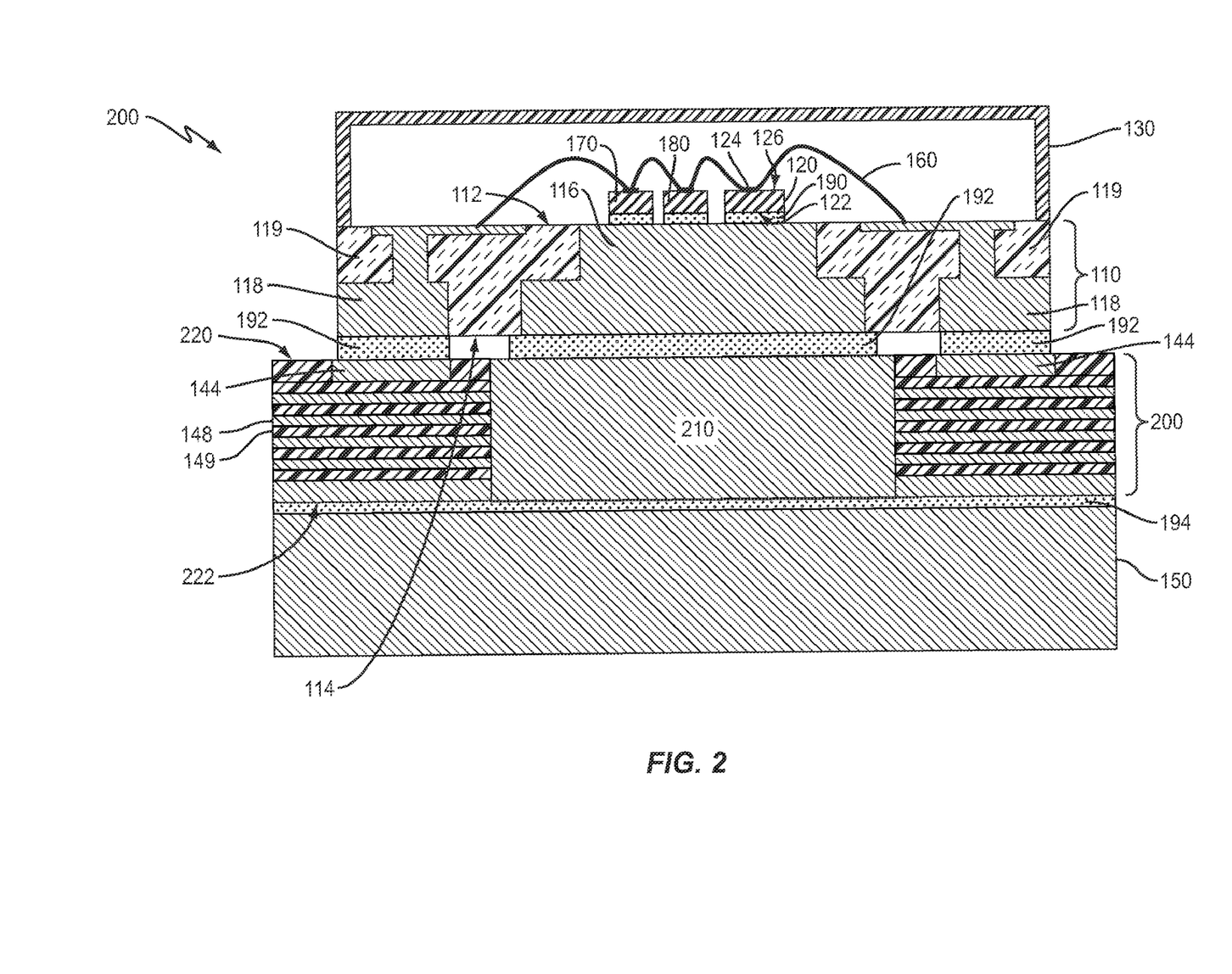
FIG. 2 is a width-wise cross-section view of another embodiment of an RF semiconductor package assembly.

FIG. 2 illustrates a width-wise cross-section view of another embodiment of an RF semiconductor package assembly 200. The semiconductor package assembly also includes the substrate 110, one or more RF semiconductor dies 120, lid 130, circuit board 200 and larger heat sink 150. The circuit board 200 is a multi-layer PCB. However, unlike the previous embodiment, the multi-layer PCB 200 has a single copper inlay 210 extending from the top surface 220 of the multi-layer PCB 210 to the bottom surface 222 of the multi-layer PCB 200. The single copper inlay 210 is surface-mounted to the base region 116 of the substrate 110 at the bottom surface 114 of the substrate 110, e.g. using a solder material 192. The single copper inlay 210 is more effective at dissipating heat from the base region 116 of the substrate 110, and is thus better suited for higher power applications, e.g. >50 Watts. The multi-layer PCB 140 shown in FIG. 1 with conductive vias 146 has a lower heat dissipation capacity, and thus is more ideally equipped for lower power applications, e.g. <50 Watts.

In either case, the substrate 110 has internal lead structures 116, 118 having flat mountable external contacts on the backside 114 of the substrate 110 for mounting to a circuit board 140, 200 as described above rather than external conventional offset-straight leads or gull wing type leads, which extend beyond the body of the package. The substrate 110 is a surface-mountable circuit component which can dissipate significant heat generated by the RF semiconductor die(s) 120, e.g. in high power, high frequency applications.

Figure 3:
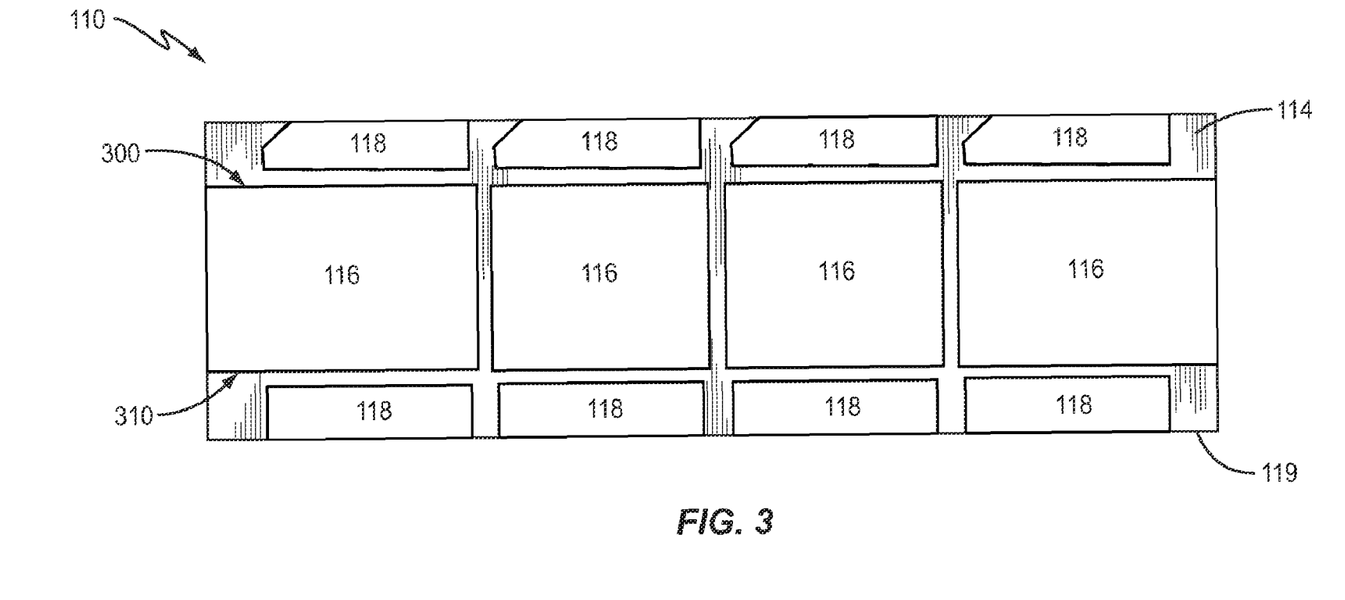
FIG. 3 is a bottom plan view of an embodiment of an RF semiconductor substrate.

FIG. 3 shows a plan view of the bottom surface 114 of the substrate 110. The bottom surface 114 of the substrate 110 is surface-mounted to a circuit board 140/200 as described above. According to this embodiment, the substrate 110 has a plurality of the metallic base regions 116 extending from the generally planar top substrate surface (out of view) to the generally planar bottom surface 114 of the substrate 110. A different RF semiconductor die 120, and any corresponding support die 170, 180, can be surface-mounted to each of the base regions 116 as explained above. The base regions 116 are spaced apart from one another by the insulative material 119 of the substrate 110. Providing a separate base region 116 for each RF semiconductor die 120 instead of one thick, continuous conductive layer better maintains package integrity during subsequent die and circuit board mounting steps. A long, thick single conductor is prone to warping and bowing during subsequent attach processes as compared to the smaller separated base regions 116 which are separated from one another by the insulative material 119. The insulative material 119 provides mechanical support and reduces bowing and warping that would otherwise occur to the base regions 116. This way, the substrate 110 remains relatively flat during the assembly process.

The substrate 110 also includes a pair of metallic signal terminal regions 118 adjacent first and second opposing sides 300, 310 of each base region 116. Each pair of signal terminal regions 118 are surface-mountable on both sides of the substrate 110, and provide electrical input/output signal connection pathways. Each signal terminal region 118 extends from the top substrate surface (out of view) to the bottom surface 114 of the substrate 110. Unlike conventional gull wing-type leads, the signal terminal regions 118 do not extend laterally outward from the substrate 110, and thus electrical connections are made at the top and bottom of the substrate 110 and not the sides. Each signal terminal 118 is separated from the base regions 116 and the other signal terminal regions 118 by the insulative material 119. Each base region 116 and corresponding pair of signal terminal regions 118 can be surface-mounted at the bottom surface 114 of the substrate 110, e.g. to a circuit board 140, 200 as described above. While four metallic base regions 116 are shown in FIG. 3, any number of base regions may be provided. In some embodiments, a single metallic base region 116 is provided, e.g. for those applications requiring only a single RF semiconductor die 120. In other embodiments, two or three metallic base regions 116 are provided when more than one RF semiconductor die 120 is employed. The substrate 110 can include more than four base regions 116 when desired, each base region 116 being separated by the insulative material 119 to reduce bowing and warping during subsequent processing.

Figure 4:
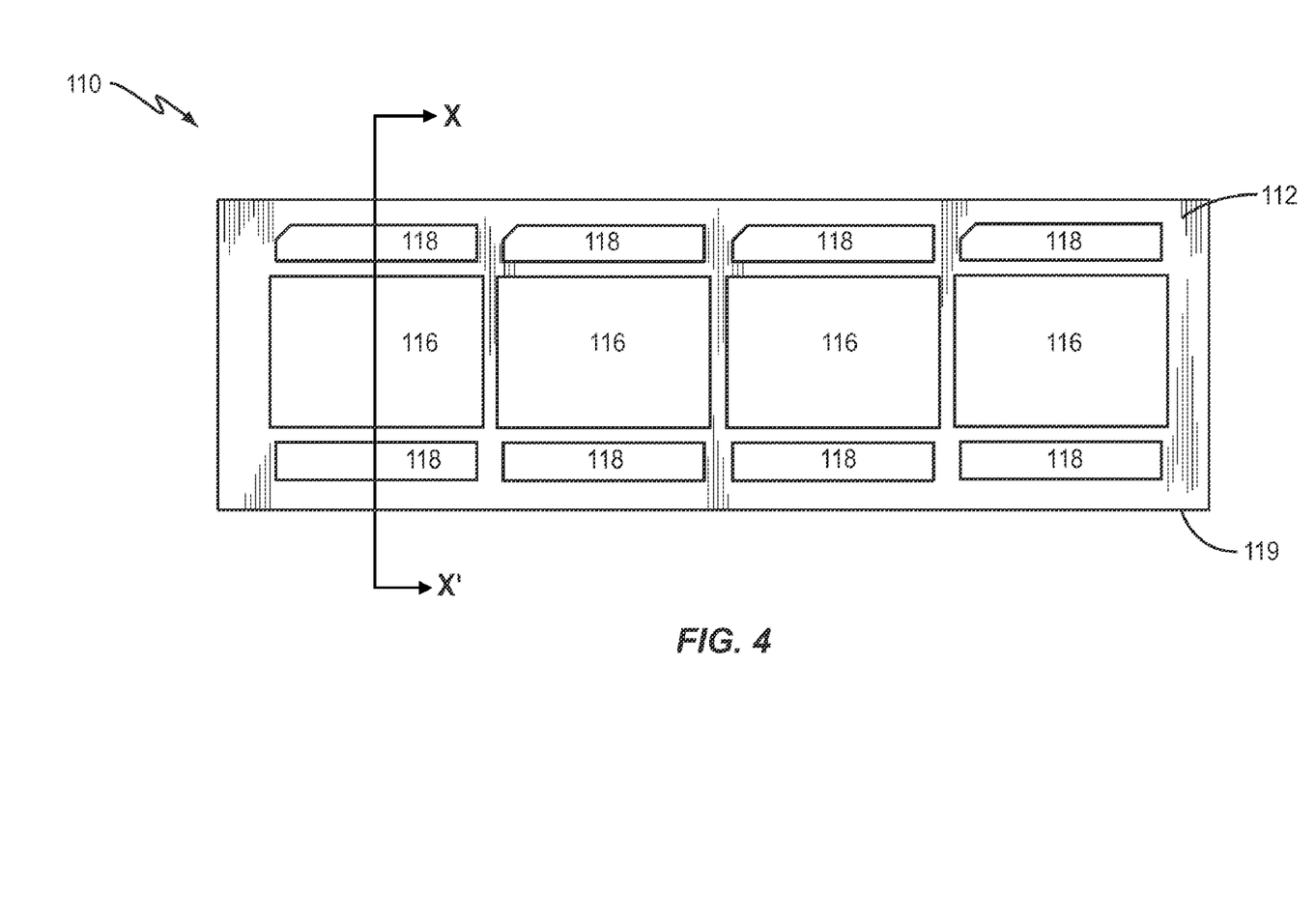
FIG. 4 is a top plan view of the RF semiconductor substrate of FIG. 3.

FIG. 4 shows a plan view of the top surface 112 of the substrate 110. Each base region 116 can be surface-mounted at the top surface 112 of the substrate 110 to the bottom surface 122 of a corresponding RF semiconductor die 120 and any corresponding support die 170, 180. A lid 130 can be attached to the top surface of the substrate 110 so that each die 120, 170, 180 is enclosed by the lid 130 to form an open-cavity around each die 120, 170, 180. FIG. 4 again shows four metallic base regions 116, however any number of base regions may be provided as explained above. Thus, the substrate 110 can include any number of metallic base regions 116, each base region 116 being separated by the insulative material 119 to reduce bowing and warping during subsequent processing.

Figure 5:
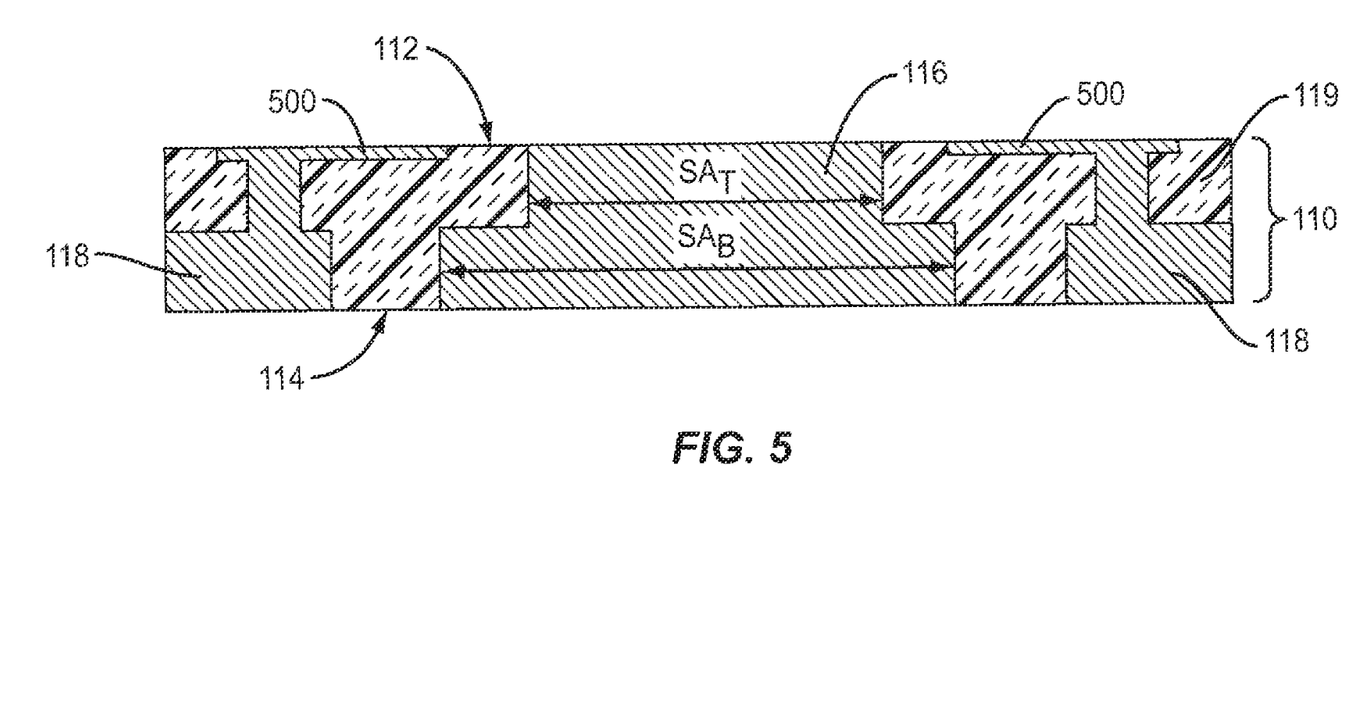
FIG. 5 is a width-wise cross-section view of the RF semiconductor substrate of FIG. 3.

FIG. 5 shows a width-wise cross-section of the substrate 110 along the line labeled X-X' in FIG. 4. FIG. 5 shows the base regions 116 being spaced apart from one another by the insulative material 119. The insulative material 119 also separates each signal terminal region 118 from the base regions 116 and the other signal terminal regions 118. In some embodiments, each base region 116 has a surface area $SA_B$ closer to the bottom surface 114 of the substrate 110 that is larger than a surface area $SA_T$ closer to the top surface 112 of the substrate 110. Thus, each base region 116 has a larger contact area for surface-mounting at the bottom surface 114 compared to the top surface 112. The signal terminal regions 118 may also have a surface area larger closer to the bottom substrate surface 114 than the top substrate surface 112, e.g. as shown in FIGS. 3 and 4. In some embodiments, a thin layer of plated copper 500, e.g. 40 µm to 50 µm thick is disposed on each metallic signal terminal region 118 at the top surface 112 of the substrate 110 for increasing the contact area of the signal terminal regions 118. The signal terminal regions 118 can extend from the bottom surface 114 of the substrate 110 to the top surface 112 of the substrate 110 as pillars, bars, vias, or any other desirable shape.

Figure 6:
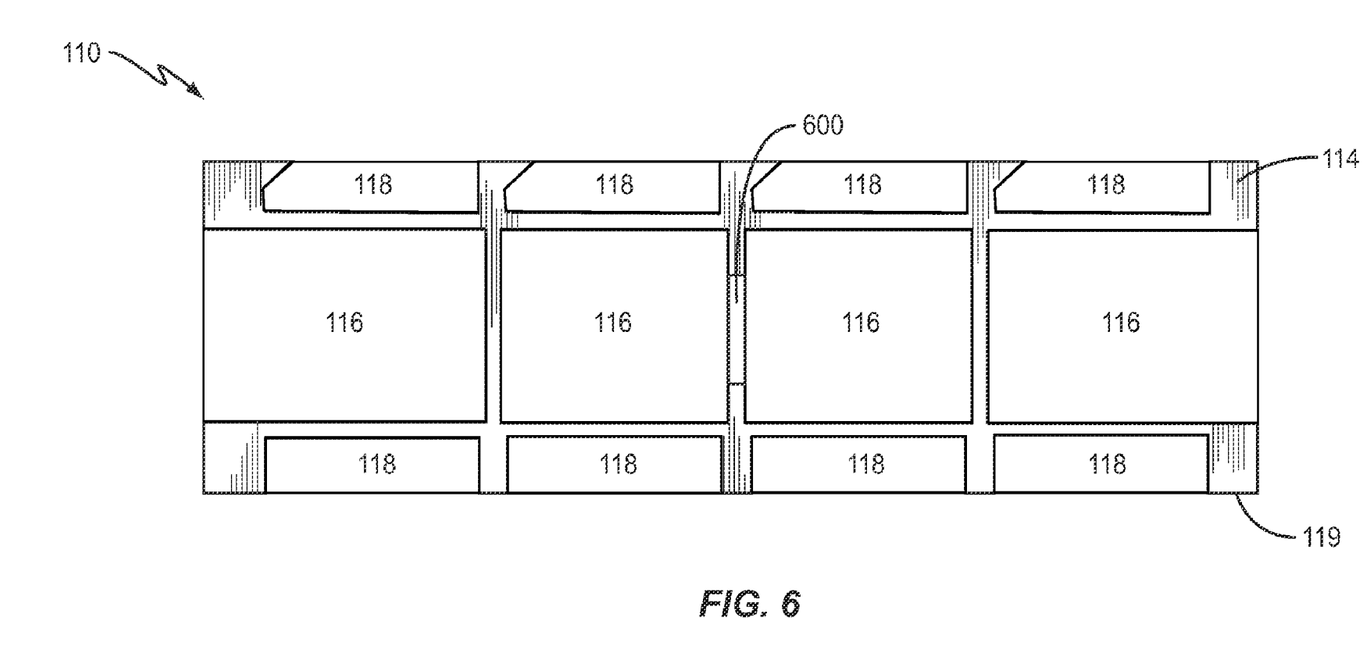
FIG. 6 is a bottom plan view of another embodiment of an RF semiconductor substrate.

FIG. 6 shows a plan view of the bottom surface 114 of the substrate 110 having two or more of the metallic base regions 116, with a thin metal layer 600 connecting the two innermost base regions 116. In some embodiments, the thin metal layer 600 is layer of plated copper about 40 µm to 50 µm thick. Additional thin metal layers (not shown) can be provided for connecting additional ones of the base regions 116 if more than two base regions 116 are included in the substrate as shown in FIG. 6. This way, some or all of the base regions 116 can be coupled to the same electrical potential without using a thick, continuous metal conductor which may warp and bow during subsequent processing.

Figure 7:
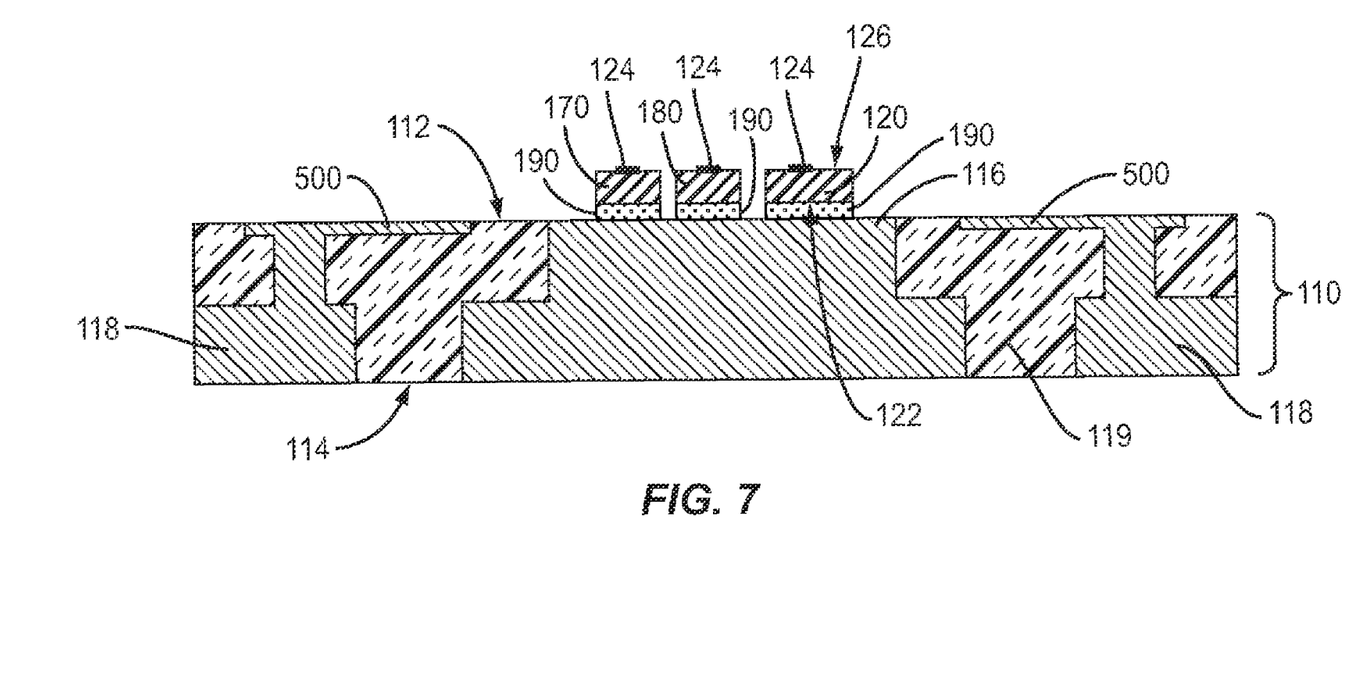
FIGS. 7 and 8 are width-wise cross-section views of an embodiment of an RF semiconductor package during different stages of manufacturing.

FIG. 7 shows a width-wise cross-section of the substrate 110 along the line labeled X-X' in FIG. 4 after an RF semiconductor die 120 is surface-mounted to one of the metallic base regions 116 of the substrate 110 at the top surface 112 of the substrate. One or more passive components 170, 180 can also be surface-mounted to the base region 116 of the substrate 110 at the top substrate surface 112, e.g. to form input and/or output matching networks. In one embodiment, the bottom surface 122 of the RF semiconductor die 120 and passive component(s) 170, 180 are attached to the base region 116 using a solder material 190.

Figure 8:
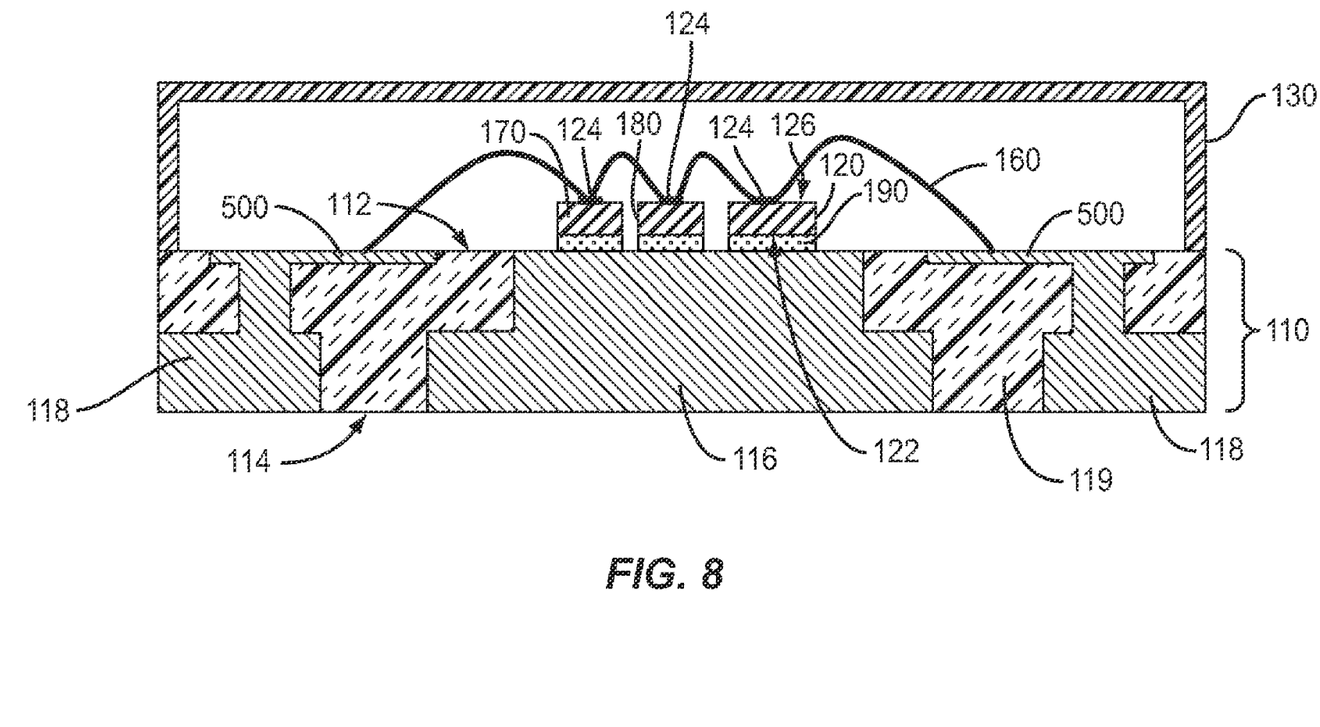

FIG. 8 shows a width-wise cross-section of the substrate 110 along the line labeled X-X' in FIG. 4 after electrical connections are formed to the RF semiconductor die 120 and optional support die 170, 180 and the lid 130 is attached to the top surface 112 of the substrate 110. One or more of the terminal pads 124 disposed on the top surface 126 of the RF semiconductor die 120 can be directly connected to respective ones of the substrate signal terminal regions 118, e.g. using bond wires 160, ribbons or some other type of conductor as shown on the right-hand side of the RF semiconductor die 120 in FIG. 8. One or more different ones of the terminal pads 124 of the RF semiconductor die 120 can be connected to other respective ones of the substrate signal terminal regions 118 through the support die 170, 180 surface-mounted to the base region 116 of the substrate 110 as shown on the left-hand side of the RF semiconductor die 120 in FIG. 8. For example, a terminal pad 124 on the top surface 126 of the RF semiconductor die 120 can be connected to a terminal pad 124 on one of the support die 170, 180. In each case, the lid 130 is attached to the outer perimeter of the top substrate surface 112. The lid 130 encloses the RF semiconductor die 120 and optional support die 170, 180 without encapsulating the devices, thus forming an open-cavity. The bottom surface 114 of the substrate 110 can then be surface-mounted to a circuit board 140, 200 as previously described herein.

A manufacturer of circuit boards that uses the surface-mountable RF semiconductor package previously described herein can more easily automate the assembly onto PCBs using standard solder reflow processes, eliminating extra steps required to mount conventional RF power packages, such as fastening a flange to a heat sink and separate hand soldering. In addition, the inductance path of the package is significantly reduced thereby increasing RF performance. The open cavity nature of the package allows for high performance RF power applications. Also, overall size of the package is reduced, thereby reducing PCB area and allowing board components to be placed much closer to the RF semiconductor device, further reducing the inductance path. Impedance matching networks can be added within the package as previously described herein and significantly higher amounts of heat energy can be dissipated by the substrate. The surface mount capability of the RF semiconductor package previously described herein significantly reduces amplifier and other PCB assembly costs by allowing a solder screen and reflow process without having to separately bolt and/or solder the structure to a larger heat sink as described next.

Figure 9:
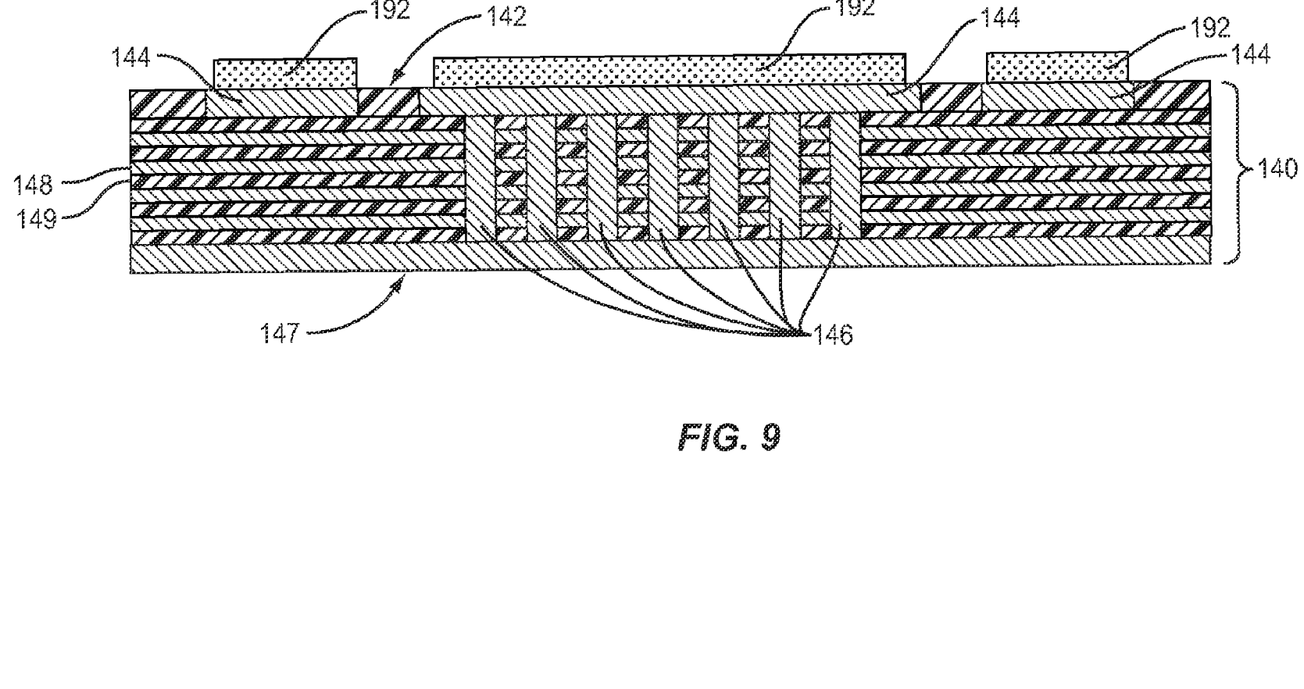
FIG. 9 is a width-wise cross-section view of an embodiment of a multi-layer PCB after solder paste screen printing during assembly of an RF semiconductor package.

FIG. 9 shows a width-wise cross-section view of the multi-layer PCB 140 of FIG. 1 which has the conductive vias 146 for transferring heat, prior to mounting of the substrate 110. According to this embodiment, a solder paste 192 is screen printed onto the conductors 144 in the top surface 142 of the circuit board 140. The solder paste 192 can be any suitable thickness, e.g. 4 to 6 mils thick. The solder paste 192 can have other thicknesses. The solder paste 192 may be in the form of a thin solid preform, e.g. 1 to 2 mils thick. Other forms of solder paste 192 can also be used. In each case, the base region 116 and each signal terminal region 118 of the substrate 110 is mounted onto the solder paste 192 at the bottom surface 114 of the substrate 110. The solder paste 192 is then reflowed to surface-mount the conductors 144 disposed in the top surface 142 of the circuit board 140 to the base region 116 and each signal terminal region 118 of the substrate 110 as shown in FIG. 1 and previously described herein. The RF semiconductor package assembly 100 is then ready for higher-level assembly.

Figure 10:
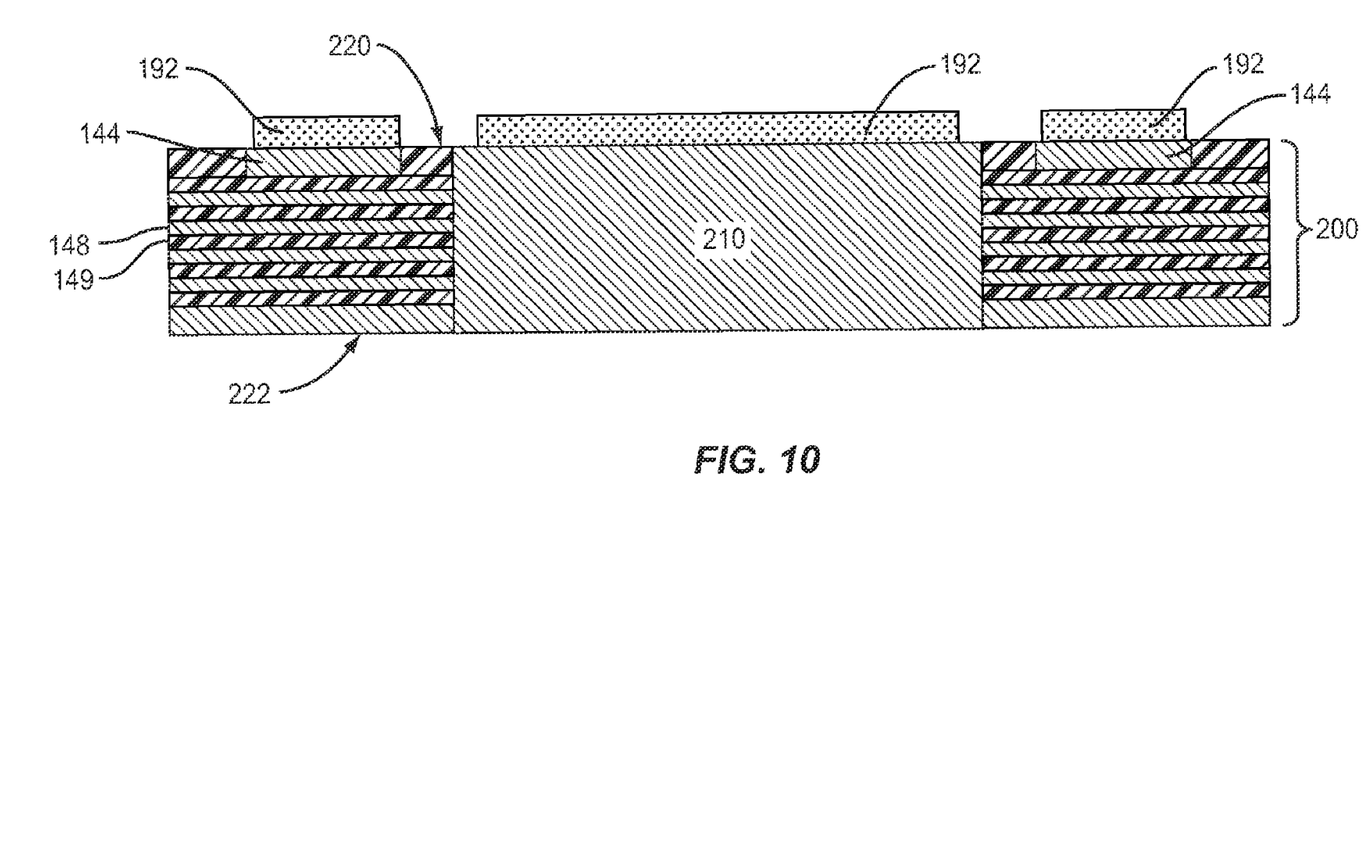
FIG. 10 is a width-wise cross-section view of another embodiment of a multi-layer PCB after solder paste screen printing during assembly of an RF semiconductor package.

FIG. 10 shows a width-wise cross-section view of the multi-layer PCB 210 of FIG. 2 which has the solid copper inlay 210 for transferring heat, prior to mounting of the substrate 110. Solder paste 192 is screen printed onto the copper inlay 210 and the conductors 144 in the top surface 220 of the circuit board 200 as described above. The base region 116 and each signal terminal region 118 of the substrate is then mounted onto the solder paste 192 at the bottom surface 114 of the substrate 110. The solder paste 192 is then reflowed to surface-mount the base region 116 of the substrate 110 to the copper inlay 210 and each signal terminal region 118 of the substrate 110 to the corresponding conductor 144 disposed in the top surface 220 of the circuit board 200 as shown in FIG. 2 and previously described herein. The RF semiconductor package assembly 200 is then ready for higher-level assembly.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An RF semiconductor package, comprising:
 a substrate having generally planar top and bottom surfaces, the substrate comprising a metallic base region extending from the top surface to the bottom surface, one or more metallic signal terminal regions extending from the top surface to the bottom surface without extending laterally outward from the substrate, and an insulative material separating the metallic regions from one another;
 an RF semiconductor die having a bottom surface surface-mounted to the base region of the substrate at the top surface of the substrate, the RF semiconductor die having a terminal pad disposed at a top surface of the RF semiconductor die, the terminal pad being electrically connected to one of the signal terminal regions of the substrate at the top surface of the substrate;
 a lid attached to the top surface of the substrate so that the RF semiconductor die is enclosed by the lid to form an open-cavity around the RF semiconductor die; and
 wherein the base region and each signal terminal region of the substrate are configured for surface-mounting at the bottom surface of the substrate.

2. The RF semiconductor package of claim 1, wherein the base region of the substrate has a larger surface area at the bottom surface of the substrate than at the top surface of the substrate.

3. The RF semiconductor package of claim 1, further comprising a plurality of passive components surface-mounted to the base region of the substrate at the top surface of the substrate.

4. The RF semiconductor package of claim 3, wherein each passive component is electrically connected to at least one of the RF semiconductor die, another one of the passive components and one of the signal terminal regions of the substrate at the top surface of the substrate.

5. The RF semiconductor package of claim 3, wherein the plurality of passive components are connected to form one or more matching networks electrically connected to the RF semiconductor die.

6. The RF semiconductor package of claim 1, further comprising a layer of plated copper disposed on each signal terminal region of the substrate at the top surface of the substrate.

7. The RF semiconductor package of claim 1, wherein the substrate has a plurality of metallic base regions extending from the top surface of the substrate to the bottom surface of the substrate, the plurality of base regions are separated from one another by the insulative material of the substrate, and a different RF semiconductor die is surface-mounted to each of the plurality of base regions at the top surface of the substrate.

8. The RF semiconductor package of claim 1, wherein the bottom surface of the RF semiconductor die is a source terminal of the RF semiconductor die, a first one of the signal terminal regions of the substrate is electrically connected to an input terminal pad of the RF semiconductor die, and a second one of the signal terminal regions of the substrate is electrically connected to an output terminal pad of the RF semiconductor die.

9. A method of manufacturing an RF semiconductor package, comprising:
providing a substrate having generally planar top and bottom surfaces, the substrate comprising a metallic base region extending from the top surface to the bottom surface, one or more metallic signal terminal regions extending from the top surface to the bottom surface without extending laterally outward from the substrate, and an insulative material separating the metallic regions from one another, wherein the base region and each signal terminal region are configured for surface-mounting at the bottom surface of the substrate;
surface-mounting a bottom surface of an RF semiconductor die to the base region of the substrate at the top surface of the substrate;
electrically connecting a terminal pad disposed at a top surface of the RF semiconductor die to one of the signal terminal regions of the substrate at the top surface of the substrate; and
attaching a lid to the top surface of the substrate so that the lid encloses the RF semiconductor die to form an open-cavity around the RF semiconductor die.

10. The method of claim 9, further comprising surface-mounting a plurality of passive components to the base region of the substrate at the top surface of the substrate.

11. The method of claim 10, comprising electrically connecting each passive component to at least one of the RF semiconductor die, another one of the passive components and one of the signal terminal regions of the substrate at the top surface of the substrate.

12. The method of claim 10, comprising electrically connecting one or more matching networks formed from the plurality of passive components to the RF semiconductor die.

13. The method of claim 9, further comprising plating a layer of copper on each signal terminal region of the substrate at the top surface of the substrate before the terminal pad disposed at the top surface of the RF semiconductor die is electrically connected to one of the signal terminal regions of the substrate.

14. The method of claim 9, comprising:
separating a plurality of base regions extending from the top surface of the substrate to the bottom surface of the substrate from one another by the insulative material of the substrate; and
surface-mounting a different RF semiconductor die to each of the plurality of base regions at the top surface of the substrate.

15. An RF semiconductor package assembly, comprising:
a substrate having generally planar top and bottom surfaces, the substrate comprising a metallic base region extending from the top surface to the bottom surface, one or more metallic signal terminal regions extending from the top surface to the bottom surface without extending laterally outward from the substrate, and an insulative material separating the metallic regions from one another;
an RF semiconductor die having a bottom surface surface-mounted to the base region of the substrate at the top surface of the substrate, the RF semiconductor die having a terminal pad disposed at a top surface of the RF semiconductor die, the terminal pad being electrically connected to one of the signal terminal regions of the substrate at the top surface of the substrate;
a lid attached to the top surface of the substrate so that the RF semiconductor die is enclosed by the lid to form an open-cavity around the RF semiconductor die; and
a circuit board having a generally planar top surface with conductors surface-mounted to the base region and each signal terminal region of the substrate at the bottom surface of the substrate.

16. The RF semiconductor package assembly of claim 15, wherein the circuit board is a multi-layer printed circuit board comprising a plurality of conductive vias extending from a bottom surface of the multi-layer printed circuit board to the conductor at the top surface of the multi-layer printed circuit board surface-mounted to the base region of the substrate.

17. The RF semiconductor package assembly of claim 15, wherein the circuit board is a multi-layer printed circuit board comprising a single copper inlay extending from the top surface of the multi-layer printed circuit board to a bottom surface of the multi-layer printed circuit board, the single copper inlay being surface-mounted to the base region of the substrate.

18. The RF semiconductor package assembly of claim 15, wherein the substrate comprises a plurality of metallic base regions extending from the top surface of the substrate to the bottom surface of the substrate, the plurality of metallic base regions are separated from one another by the insulative material of the substrate, a different RF semiconductor die is surface-mounted to each of the plurality of metallic base regions at the top surface of the substrate, and each of the plurality of metallic base regions is surface-mounted at the bottom surface of the substrate to one of the conductors in the top surface of the circuit board.

19. The RF semiconductor package assembly of claim 15, wherein the bottom surface of the RF semiconductor die is a source terminal of the RF semiconductor die, a first one of the signal terminal regions of the substrate is electrically connected to an input terminal pad of the RF semiconductor die, and a second one of the signal terminal regions of the substrate is electrically connected to an output terminal pad of the RF semiconductor die.

20. A method of manufacturing an RF semiconductor package assembly, comprising:
providing a substrate having generally planar top and bottom surfaces, the substrate comprising a metallic base region extending from the top surface to the bottom surface, one or more metallic signal terminal regions extending from the top surface to the bottom surface without extending laterally outward from the substrate, and an insulative material separating the metallic regions from one another;

surface-mounting a bottom surface of an RF semiconductor die to the base region of the substrate at the top surface of the substrate;

electrically connecting a terminal pad disposed at a top surface of the RF semiconductor die to one of the signal terminal regions of the substrate at the top surface of the substrate;

attaching a lid to the top surface of the substrate so that the lid encloses the RF semiconductor die to form an open-cavity around the RF semiconductor die; and surface-mounting conductors disposed in a generally planar top surface of a circuit board to the base region and each signal terminal region of the substrate at the bottom surface of the substrate.

21. The method of claim 20, comprising:

screen-printing a solder paste onto the conductors in the top surface of the circuit board;

mounting the base region and each signal terminal region of the substrate onto the solder paste at the bottom surface of the substrate; and reflowing the solder paste to surface-mount the conductors in the top surface of the circuit board to the base region and each signal terminal region of the substrate.

22. The method of claim 20, comprising:

separating a plurality of metallic base regions extending from the top surface of the substrate to the bottom surface of the substrate from one another by the insulative material of the substrate;

surface-mounting a different RF semiconductor die to each of the plurality of metallic base regions at the top surface of the substrate; and surface-mounting each of the plurality of metallic base regions to one of the conductors in the top surface of the circuit board at the bottom surface of the substrate.

23. An RF semiconductor substrate, comprising:

a plurality of metallic base regions extending from a generally planar top surface of the RF semiconductor substrate to a generally planar bottom surface of the RF semiconductor substrate, the plurality of base regions being spaced apart from one another by an insulative material; and a pair of metallic signal terminal regions adjacent first and second opposing sides of each base region, each signal terminal region extending from the top surface to the bottom surface without extending laterally outward from the substrate and being separated from each base region and the other signal terminal regions by the insulative material;

wherein each base region is configured to be surface-mounted at the top surface of the RF semiconductor substrate to a bottom surface of an RF semiconductor die;

wherein the top surface of the RF semiconductor substrate is configured to have a lid attached to the top surface so that each RF semiconductor die is enclosed by the lid to form an open-cavity around each RF semiconductor die; and wherein each base region and corresponding pair of signal terminal regions are configured for surface-mounting at the bottom surface of the RF semiconductor substrate.

24. The RF semiconductor substrate of claim 23, further comprising a metal layer disposed on the top surface or the bottom surface of the RF semiconductor substrate, the metal layer connecting two or more of the plurality of base regions.

25. The RF semiconductor substrate of claim 23, wherein each metallic base region has a surface area larger at the bottom surface of the RF semiconductor substrate than at the top surface of the RF semiconductor substrate.

26. The RF semiconductor substrate of claim 23, further comprising a layer of plated copper disposed on each metallic signal terminal region at the top surface of the RF semiconductor substrate.

* * * * *